United States Patent [19]
Kim

[11] Patent Number: 6,040,212
[45] Date of Patent: Mar. 21, 2000

[54] METHODS OF FORMING TRENCH-GATE SEMICONDUCTOR DEVICES USING SIDEWALL IMPLANTATION TECHNIQUES TO CONTROL THRESHOLD VOLTAGE

[75] Inventor: Hyun-Chul Kim, Kyungki-do, Rep. of Korea

[73] Assignee: Fairchild Korea Semiconductor, Ltd., Kyungki-do, Rep. of Korea

[21] Appl. No.: 08/833,403

[22] Filed: Apr. 4, 1997

[30] Foreign Application Priority Data

Aug. 16, 1996 [KR] Rep. of Korea ...................... 96-33956

[51] Int. Cl.$^7$ ............................................. H01L 21/8242
[52] U.S. Cl. ........................................ 438/242; 438/270
[58] Field of Search ................................... 438/206, 207, 438/212, 242, 259, 268, 270

[56] References Cited

U.S. PATENT DOCUMENTS

| | | | |
|---|---|---|---|
| 4,914,058 | 4/1990 | Blanchard | 437/203 |
| 5,021,355 | 6/1991 | Dhong et al. | 437/35 |
| 5,323,040 | 6/1994 | Baliga | 257/332 |
| 5,471,075 | 11/1995 | Shekar et al. | 257/139 |
| 5,488,236 | 1/1996 | Baliga et al. | 257/132 |
| 5,512,517 | 4/1996 | Bryant | 437/203 |
| 5,558,313 | 9/1996 | Hshieh et al. | 257/342 |

OTHER PUBLICATIONS

"Silicon Processing for the VLSI Era Volume 2—Process Integration", S. Wolf, Lattice Press, 1990, pp. 298–299.

H. Takahashi et al., Carrier Stored Trench–Gate Bipolar Transistor (CSTBT)—A Novel Power Device for High Voltage Application–, ISPSD '96 Proceedings, The 8th International Symposium On Power Semiconductor Devices and IC's, IEEE Catalog Number:96CH35883, May 20–23, 1996, pp. 349–352.

*Primary Examiner*—Joni Y. Chang
*Attorney, Agent, or Firm*—Myers Bigel Sibley and Sajovec

[57] ABSTRACT

Methods of forming trench-gate semiconductor devices using sidewall implantation techniques include the steps of forming a semiconductor substrate containing a trench-gate semiconductor device therein (e.g., MOSFET, IGBT) and then implanting dopants of predetermined conductivity type into a sidewall of the trench to adjust the threshold voltage of the semiconductor device. In particular, a method is provided which comprises the steps of forming a semiconductor substrate containing a trench therein at a first face thereof, a body region of second conductivity type (e.g., P-type) extending adjacent a sidewall of the trench and a source region of first conductivity type in the body region and extending adjacent a sidewall of the trench and adjacent the first face. An electrically insulating region (e.g., $SiO_2$) is also formed on a sidewall of the trench and an electrically conductive region is formed in the trench. To adjust the threshold voltage of the semiconductor device, dopants of first conductivity type are implanted through the electrically insulating region and through the sidewall of the trench and into the source region of first conductivity type. Preferably, these implanted dopants are diffused into the channel region of the semiconductor device during subsequent thermal treatment steps to adjust the threshold voltage of the semiconductor device to preferred levels.

11 Claims, 2 Drawing Sheets

METHODS OF FORMING TRENCH-GATE SEMICONDUCTOR DEVICES USING SIDEWALL IMPLANTATION TECHNIQUES TO CONTROL THRESHOLD VOLTAGE

FIELD OF THE INVENTION

The present invention relates to methods of forming semiconductor switching devices, and more particularly to methods of forming semiconductor switching devices for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop of power MOSFETs increases with increasing temperature, thereby promoting an even current distribution in parallel connected devices.

In view of these desirable characteristics, many variations of power MOSFETs have been designed. As illustrated by FIG. 1, one type of MOSFET is a vertical MOSFET having a trench gate. In this vertical MOSFET, a relatively lightly doped N-type drift region 3 is formed on a relatively highly doped N-type substrate 1. In addition, a P-type body region 5 is provided in the drift region 3 and an N-type source region 7 is provided in the body region 5. A trench "t" is also provided at a face of the drift region 3. The trench "t" extends through the source region 7 and through the body region 5, as illustrated. An insulated gate electrode is also provided in the trench. The insulated gate electrode includes a gate electrode 11 which is surrounded by electrically insulating regions 9 and 13 (e.g., SiO$_2$). A patterned phosphosilica glass (PSG) layer 15 is also formed on the insulated gate electrode. The patterned PSG layer 15 exposes a portion of the source region 7 and body region 5. A layer of metallization is also formed on the exposed portions of the source region 7 and body region 5. This layer of metallization comprises a first electrode 17.

As will be understood by those skilled in the art, the body region 5 may be formed by initially forming a relatively lightly doped P-type well region and then increasing the doping concentration of the well region in the vicinity of the first electrode 17 using an ion implantation step. This increase in doping concentration in the body region 5 facilitates the formation of an ohmic contact with the first electrode 17 and improves the breakdown voltage of the vertical MOSFET. Unfortunately, the increase in doping concentration in the vicinity of the first electrode 17 may also influence the doping concentration of the body region 5 in the vicinity of the sidewall of the trench "t" if the spacing between adjacent trenches (in a multicelled device) is decreased to achieve increased integration densities or the ion implantation step is misaligned. As will be understood by those skilled in the art, any increase in the doping concentration of the body region 5 in the vicinity of the trench may increase the MOSFETs threshold voltage and deteriorate the MOSFETs turn-on and other electrical characteristics.

Thus, notwithstanding the above attempts to develop power MOSFETs and MOSFET-controlled semiconductor devices, there still continues to be a need for improved semiconductor devices for power applications.

SUMMARY OF THE INVENTION

It is therefore an object of the present invention to provide improved methods of forming vertical semiconductor devices.

It is another object of the present invention to provide methods of forming vertical trench-gate semiconductor devices having improved threshold voltages.

These and other objects, features and advantages are provided, according to the present invention, by methods of forming gate-controlled semiconductor devices which include the steps of forming a semiconductor substrate containing a trench-gate semiconductor device therein (e.g., MOSFET, IGBT) and then implanting dopants of predetermined conductivity type into a sidewall of the trench to adjust the threshold voltage of the semiconductor device. According to one embodiment of the present invention, a method is provided which comprises the steps of forming a semiconductor substrate containing a trench therein at a first face thereof, a body region of second conductivity type (e.g., P-type) extending adjacent a sidewall of the trench and a source region of first conductivity type in the body region and extending adjacent a sidewall of the trench and adjacent the first face. An electrically insulating region (e.g., $SiO_2$) is also formed on a sidewall of the trench and an electrically conductive region is formed in the trench. To adjust the threshold voltage of the semiconductor device, dopants of first conductivity type are implanted through the electrically insulating region and sidewall of the trench and into the source region of first conductivity type. Preferably, these implanted dopants are diffused into the channel region of the semiconductor device during subsequent thermal treatment steps, to adjust the threshold voltage of the semiconductor device to preferred levels.

According to a second embodiment of the present invention, a semiconductor substrate is formed having first and second opposing faces and a relatively lightly doped drift region (e.g., N–) therein extending to the first face. A body region of second conductivity type (e.g., P-type) is then formed in the drift region and a source region of first conductivity type is formed in the body region. The semiconductor substrate is then etched at the first face to define a trench therein having a bottom in the drift region and a sidewall which extends adjacent the body region. An electrically insulating region is then formed on the sidewall of the trench and this step is followed by the step of forming an electrically conductive region (e.g., polysilicon gate) in the trench and on the electrically insulating region. The electrically insulating and conductive regions can then be partially etched-back to thin a portion of the electrically insulating region extending adjacent an upper portion of the sidewall of the trench. Dopants of first conductivity type are then implanted through the upper portion of the sidewall of the trench and into the source and body regions. During subsequent thermal treatment, these implanted dopants diffuse downward along the sidewall of the trench. This shortens the length of the channel of the semiconductor device (in the body region) and lowers the threshold voltage of the device by confining the channel to a portion of the body region which is less susceptible to high levels of dopant. These high levels of dopant are typically implanted and/or diffused into upper portions of the body region to reduce contact resistance.

DESCRIPTION OF PREFERRED EMBODIMENTS

Figure 1:
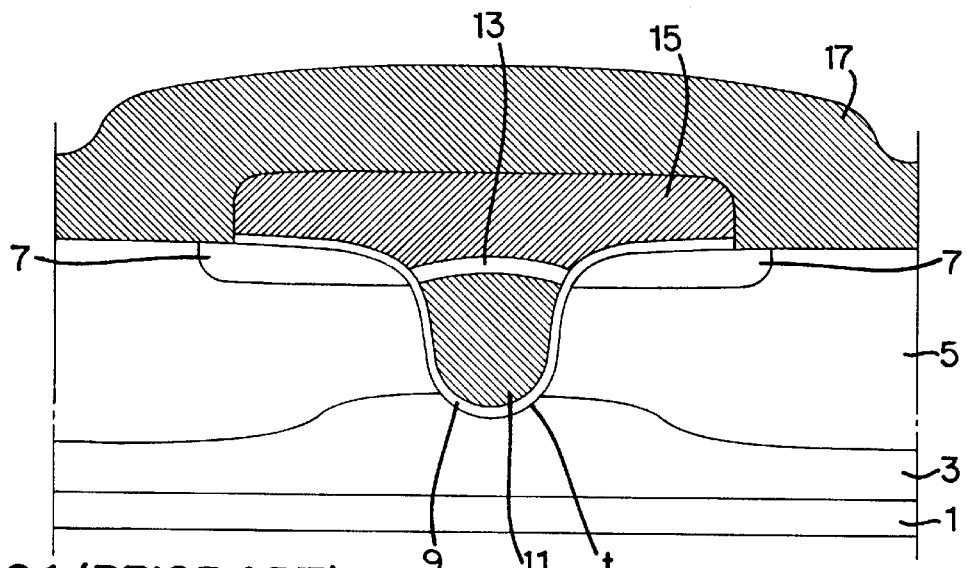
FIG. 1 illustrates a cross-sectional view of a vertical MOSFET according to the prior art.
Figure 2:
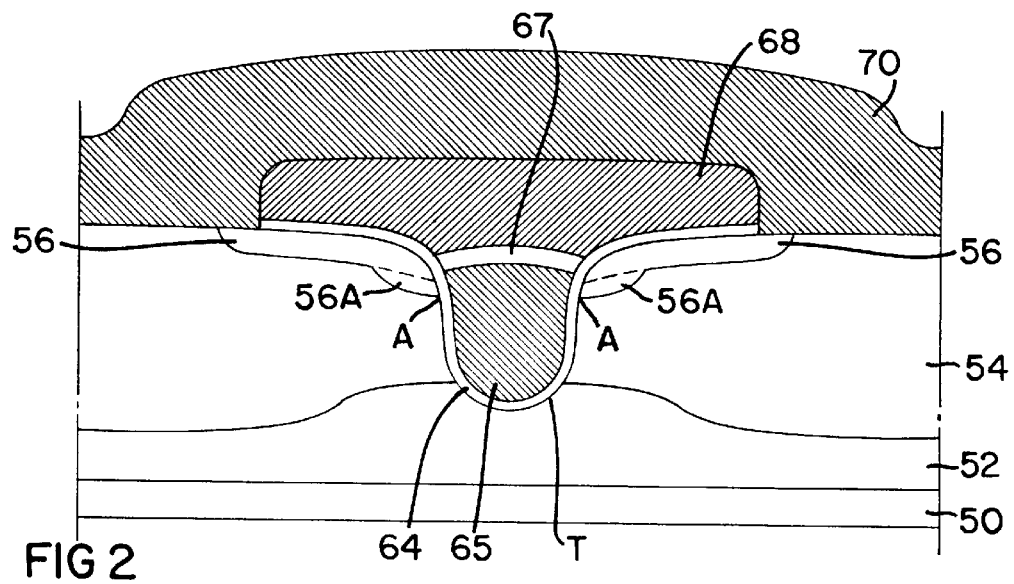
FIG. 2 illustrates a cross-sectional view of a vertical semiconductor switching device according to a first embodiment of the present invention.
Figure 3:
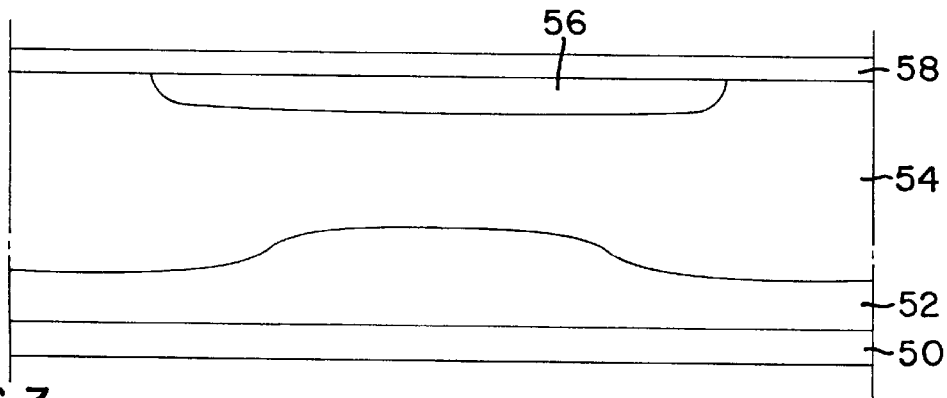
FIGS. 3–6 illustrate cross-sectional views of intermediate structures illustrating a method of forming the vertical semiconductor switching device of FIG. 2.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Referring now to FIGS. 2–6, methods of forming semiconductor switching devices according to the present invention will be described. These semiconductor switching devices may comprise vertical power semiconductor devices such as IGFETs (e.g., MOSFETs) and insulated-gate bipolar transistors (IGBTs), for example. As illustrated best by FIGS. 2 and 6, a vertical power semiconductor device may comprise a relatively highly doped buffer region 50 (e.g., N+) or substrate and a relatively lightly doped drift region 52 (e.g., N–) on the buffer region/substrate 50. As will be understood by those skilled in the art, the drift region 52 may be formed by epitaxially growing an in-situ doped drift region 52 from an upper surface of the buffer region/ substrate 50. A body region 54 is also provided in the drift region 52, as illustrated. The body region 54, which may comprise a blanket layer or a well region (e.g., P-type well), extends to an upper face of the drift region 52. The body region 54 may contain local regions of different conductivity. For example, a portion of the body region 54 extending adjacent a first electrode 70 may be more highly doped than surrounding portions of the body region 54. This higher doping level facilitates the formation of an ohmic contact between the body region 54 and the first electrode 70. Typically, this more highly doped portion of the body region 54 is formed by selectively implanting and then diffusing dopants of predetermined conductivity type into upper portions of the body region 54.

A source region 56 of relatively high conductivity is also provided in the body region 54. As described more fully hereinbelow, the source region 56 contains vertical extensions which are formed by implanting source region dopants through the sidewall of the trench T. These extensions are designed to provide threshold-voltage control by confining the channel region of the device to a portion of the body region 54 which extend adjacent an upper face of the drift region 52. To provide gate-controlled turn-on and turn-off of the vertical semiconductor device, a trench T is formed at the upper face. As illustrated, the trench T extends into the drift region 52 and has sidewalls which extend adjacent the body region 54 and source region 56. A composite electrically insulating region or layer 64 and 67 is also formed to electrically insulate a conductive gate electrode 65 from the source, body and drift regions and the first electrode 70. Additional electrical insulation is also provided by a phosphosilica glass (PSG) layer 68. Electrical contact can be made to the gate electrode 65 in a third dimension, not shown. As will be understood by those skilled in the art, the application of a predetermined potential bias to the gate electrode 65 will induce the formation of inversion-layer channels in the body region 54. These inversion-layer channels extend adjacent the sidewalls of the trench T and electrically "short" the drift region 52 to the source region 56 and initiate or sustain forward conduction.

Referring now to FIGS. 3–6, preferred methods include the steps of forming a drift region 52 of first conductivity type (e.g., N-type) on a face of a semiconductor substrate 50.

Here, the substrate may comprise a relatively highly doped buffer layer (e.g., N+) which acts as a drain region of a vertical MOSFET or acts as an intermediate region of a vertical IGBT having a second conductivity type (e.g., P-type) emitter region which forms a P-N junction with the buffer layer. The drift region 52 may be formed by epitaxially growing an in-situ doped layer of monocyrstalline silicon on the face of the substrate 50. The drift region 52 is then doped with second conductivity type dopants to form a body region 54. The body region 54 may comprise a well region or a continuous region formed by implanting second conductivity type dopants into an upper face of the drift region 52 and then diffusing the implanted dopants of second conductivity type. To protect the upper face of the drift region 52 from implant damage, a thin buffer layer 58 (e.g., oxide) may be formed on the upper face. Relatively highly doped contact regions (shown as P+) are also formed in the body region 54 by selectively implanting dopants of second conductivity type into the body region 54, using a patterned implant mask (not shown). These dopants also improve the breakdown voltage of the device. During subsequent thermal treatment (e.g., annealing), these implanted dopants also diffuse vertically and laterally into the body region. A source region 56 is then preferably formed by selectively implanting dopants of first conductivity type at relatively low energy levels, into the body region 54.

Figure 4:
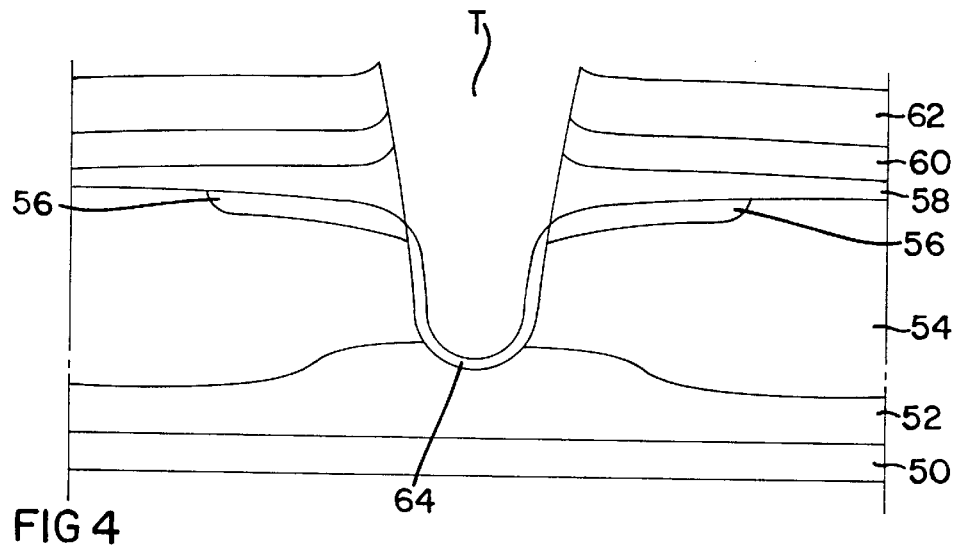

Referring now to FIG. 4, a nitride layer 60 and an oxide layer 62 are then deposited on the buffer layer 58. The nitride layer 60, oxide layer 62 and buffer layer 58 are then patterned using conventional techniques to expose a portion of the source region 56 which extends adjacent the upper face of the drift region 52. An etching step is then performed using the patterned layers as a mask to define a trench T. This trench T extends through the source region 56 and body region 54, as illustrated. A stress relief oxide layer (not shown) may then be formed on the sidewall of the trench T to remove etching damage. The stress relief oxide layer is then removed. An electrically insulating region 64 (e.g., gate oxide) is then formed on the sidewall of the trench T using conventional techniques. The electrically insulating region may be formed to have a thickness of about 1000 Å.

Figure 5:
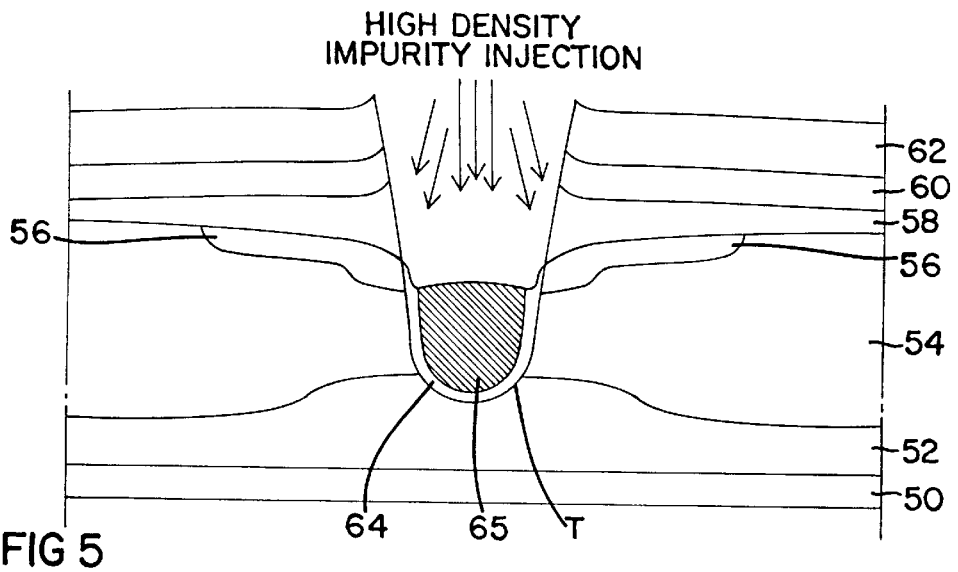

Referring now to FIG. 5, an electrically conductive region 65 (e.g., doped polycrystalline silicon) is then formed in the trench T. The electrically conductive region 65 may be formed by depositing a blanket layer of polycrystalline silicon and then etching back the deposited layer to expose those portions of the electrically insulating region 64 which extend adjacent upper portions of the sidewall of the trench T. Here, the electrically conductive region 65 is preferably formed to have an upper surface below the point of intersection (at the sidewall of the trench) between the source region 56 and the body region 54 (shown as point A in FIGS. 2 and 6). The exposed portions of the electrically insulating region 64 are also preferably etched to reduce the thickness of the electrically insulating region 64 at the periphery of the trench opening to less than about 500 Å.

Referring still to FIG. 5, dopants of first conductivity type (e.g., N-type) are then implanted at a preferred offset angle (i.e., less than 90° relative to the face of the drift region 52) through the thinned portion of the electrically insulating region 64 and through the upper portion of the sidewall of the trench T and into the body region 54 and source region 56 near the point of intersection (point "A"). This implantation step is preferably performed to form doped source region extensions 56A. These source region extensions 56A are designed to provide threshold voltage control by shortening the portion of the body region 54 in which the channel region is formed and by moving the source-side end of the channel region away from portions of the body region 54 which are relatively highly doped (i.e., away from the surface of the drift region 52). In particular, by confining the channel region to those portions of the body region 54 which are relatively lightly doped, the threshold voltage of the semiconductor device can be advantageously reduced.

Figure 6:
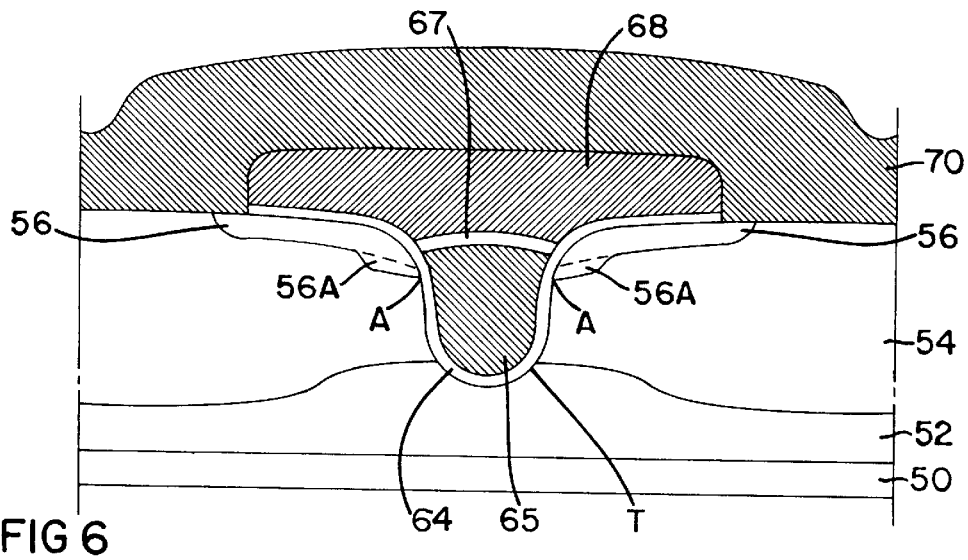

Referring now to FIG. 6, the patterned nitride layer 60, oxide layer 62 and buffer layer 58 are removed to expose the upper surface of the drift region 54 and the source and body regions therein. An upper electrically insulating region 67 (e.g., heat oxide layer) is then formed on an upper surface of the electrically conductive region 65 (i.e., gate electrode). The upper electrically insulating region 67 and the electrically insulating region 64 on the sidewall of the trench T electrically isolate the gate electrode 65 from adjacent regions. To complete the semiconductor device and make electrical contact to the source and body regions, a phosphosilica glass (PSG) layer 68 is then patterned on the upper electrically insulating region 67 and then a layer of metallization is deposited to form a first electrode 70 which ohmically contacts the source and body regions.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor switching device, comprising the steps of:

forming a semiconductor substrate containing a trench therein at a first face thereof, a body region of second conductivity type extending adjacent a sidewall of the trench, and a source region of first conductivity type in the body region and extending adjacent the sidewall of the trench and the first face;

forming an electrically insulating region on the sidewall of the trench;

forming an electrically conductive region in the trench; and implanting dopants of first conductivity type through the electrically insulating region and sidewall of the trench and into the source region of first conductivity type to increase a first conductivity type doping concentration therein.

2. The method of claim 1, wherein said implanting step is preceded by the step removing a portion of the electrically conductive region to expose a first portion of the electrically insulating region on an upper portion of the sidewall of the trench.

3. The method of claim 2, wherein said implanting step comprises implanting dopants of first conductivity type through the exposed first portion of the electrically insulating region and the upper portion of the sidewall of the trench and into the source region.

4. The method of claim 2, wherein said removing step comprises etching the electrically conductive region and the electrically insulating region; and wherein said implanting step comprises implanting dopants of first conductivity type through the upper portion of the sidewall of the trench and into the source region.

5. The method of claim 4, wherein said implanting step comprises implanting dopants of first conductivity type into the source region at an angle less than 90° relative to the first face.

6. The method of claim 5, wherein said implanting step is followed by the step of filling the trench with a second electrically insulating region.

7. A method of forming a vertical gate-controlled semiconductor switching device, comprising the steps of:

forming a semiconductor substrate having first and second opposing faces and a drift region of first conductivity type therein extending to the first face thereof;

forming a body region of second conductivity type in the drift region;

forming a source region of first conductivity type in the body region;

etching the semiconductor substrate at the first face to define a trench therein having a bottom in the drift region and a sidewall which extends adjacent the body region;

forming an electrically insulating region on the sidewall of the trench;

forming an electrically conductive region in the trench;

removing a portion of the electrically conductive region to expose a first portion of the electrically insulating region on an upper portion of the sidewall of the trench; and then implanting dopants of first conductivity type through the sidewall of the trench and into the source region.

8. The method of claim 7, wherein said implanting step comprises implanting dopants of first conductivity type through the exposed first portion of the electrically insulating region and into the source region.

9. The method of claim 8, wherein said implanting step comprises implanting dopants of first conductivity type into the source region at an angle less than 90° relative to the first face.

10. A method of forming a semiconductor switching device, comprising the steps of:

forming a MOSFET containing a trench-gate at a face of a semiconductor substrate; and implanting dopants of first conductivity type through sidewalls of the trench-gate and into a source of the MOSFET;

wherein said forming step comprises etching a trench in the face, using a first mask; and wherein said implanting step comprises implanting dopants of first conductivity type through sidewalls of the trench-gate using the first mask as an implant mask.

11. The method of claim 10, wherein said implanting step is preceded by the step of etching the trench-gate using the first mask as an etching mask.

* * * * *